United States Patent
Cho et al.

(10) Patent No.: US 7,391,644 B2
(45) Date of Patent: Jun. 24, 2008

(54) PHASE-CHANGEABLE MEMORY DEVICE AND READ METHOD THEREOF

(75) Inventors: Woo-Yeong Cho, Suwon-si (KR); Byung-Gil Choi, Yongin-si (KR); Du-Eung Kim, Yongin-si (KR); Hyung-Rok Oh, Hwaseong-si (KR); Beak-Hyung Cho, Hwaseong-si (KR); Yu-Hwan Ro, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 24 days.

(21) Appl. No.: 11/605,212

(22) Filed: Nov. 29, 2006

(65) Prior Publication Data

US 2007/0133271 A1 Jun. 14, 2007

(30) Foreign Application Priority Data

Nov. 30, 2005 (KR) ........................ 10-2005-0115629
Dec. 21, 2005 (KR) ........................ 10-2005-0127038

(51) Int. Cl.
G11C 11/00 (2006.01)
(52) U.S. Cl. ........................ 365/163; 365/203; 365/207; 365/205
(58) Field of Classification Search ................ 365/163, 365/203, 207, 189.09, 205
See application file for complete search history.

(56) References Cited

U.S. PATENT DOCUMENTS

| | | | |
|---|---|---|---|
| 6,504,761 B2 | 1/2003 | Kai et al. | |
| 6,567,296 B1 | 5/2003 | Casagrande et al. | |
| 6,667,900 B2 | 12/2003 | Lowrey et al. | |
| 6,707,712 B2 * | 3/2004 | Lowery | ........................ 365/175 |
| 2003/0026134 A1 | 2/2003 | Lowrey | |
| 2005/0128799 A1 | 6/2005 | Kurotsuchi et al. | |

FOREIGN PATENT DOCUMENTS

| | | |
|---|---|---|
| JP | 2002-124085 | 4/2002 |
| JP | 2002-237193 | 8/2002 |
| JP | 2005-514722 | 5/2005 |
| JP | 2005-166210 | 6/2005 |
| KR | 100172380 B1 | 10/1998 |
| KR | 1020010078352 A | 8/2001 |
| KR | 1020020066941 A | 8/2002 |
| KR | 1020030069652 | 8/2003 |
| KR | 1020040050534 A | 6/2004 |
| KR | 1020050029013 A | 3/2005 |
| KR | 1020050054851 A | 6/2005 |
| WO | WO 03/058632 A1 | 7/2003 |

* cited by examiner

Primary Examiner—David Lam
(74) Attorney, Agent, or Firm—Volentine & Whitt, PLLC

(57) ABSTRACT

Disclosed is a phase-changeable memory device and a related method of reading data. The memory device is comprised of memory cells, a high voltage circuit, a precharging circuit, a bias circuit, and a sense amplifier. Each memory cell includes a phase-changeable material and a diode connected to a bitline. The high voltage circuit provides a high voltage from a power source. The precharging circuit raises the bitline up to the high voltage after charging the bitline up to the power source voltage. The bias circuit supplies a read current to the bitline by means of the high voltage. The sense amplifier compares a voltage of the bitline with a reference voltage by means of the high voltage, and reads data from the memory cell. The memory device is able to reduce the burden on the high voltage circuit during the precharging operation, thus assuring a sufficient sensing margin during the sensing operation.

22 Claims, 9 Drawing Sheets

PHASE-CHANGEABLE MEMORY DEVICE AND READ METHOD THEREOF

BACKGROUND

1. Field of the Invention

The subject matter disclosed herein is concerned with semiconductor memory devices. In particular, the subject matter disclosed herein relates to memory devices that use phase-changeable materials memory devices, and methods of reading data using such memory devices.

This U.S. non-provisional patent application claims priority under 35 U.S.C. § 119 of Korean Patent Application 2005-115629 filed on Nov. 30, 2005, and Korean Patent Application 2005-127038 filed on Dec. 21, 2005, the entire contents of which are hereby incorporated by reference.

2. Description of Related Art

Semiconductor memories are devices capable of selectively storing and recalling data. Semiconductor memory devices are roughly classified into random access memories (RAMs) and read-only memories (ROMs). RAMs are a class of memory that includes dynamic RAMs (DRAMs) and static RAMs (SRAMs). ROMs are a class of memories that include programmable ROMs (PROMs), erasable PROMs (EPROMs), electrically EPROMs, and flash memory devices.

A particular form of programmable ROM that has been growing in popularity is known as "phase-changeable" RAMs (or "PRAMs), which are memory devices that use chalcogenide alloys to store data. One reason for the popularity of PRAMs is that they can be fabricated by simple manufacturing processes relative to other nonvolatile devices, which gives PRAMs an advantage in providing large-capacity storage devices at low cost.

FIG. 1 is an equivalent circuit diagram showing a unit cell of a phase-changeable memory device. Referring to FIG. 1, the unit cell 10 includes a memory element 11 and a selection element 12. The memory element 11 is connected between a bitline BL and the selection element 12. The selection element 12 is connected between the memory element 11 and a ground.

The memory element 11 contains a phage-changeable material, such as Ge—Sb—Te (GST), that can vary in resistance based on its physical state. The physical state of a phase-changeable material can take either a generally crystalline or generally amorphous state, and for the present example the state of the phase-changeable material (GST) (and thus its resistance) can be controlled based on a current supplied through the bitline BL.

The selection element 12 of the unit cell 10 is an NMOS transistor NT. Note that the gate of the NMOS transistor NT is coupled to a wordline WL. When a predetermined voltage is applied to the wordline WL, the NMOS transistor NT is turned on to supply a current to the memory element 11 through the bitline BL. While in FIG. 1 the memory element 11 is connected between the bitline BL and the selection element 12, the selection element 12 may be connected between the bitline BL and the memory element 11.

FIG. 2 is an equivalent circuit diagram showing another unit cell 20 of a phase-changeable memory device. Referring to FIG. 2, the unit cell 20 includes a memory element 21 and a selection element 22 with the memory element 21 connected between a bitline BL and the selection element 22. The present memory element 21 is the same as the memory element 11 shown in FIG. 1. The present selection element 22 is composed of a diode D.

In operation, when a voltage difference between the anode and cathode of the selection element 22 (diode D) becomes higher than the diode's threshold, the selection element 22 is turned on to supply a current to the memory element 21 through the bitline BL. Accordingly, the resistance of the memory element 21 can be measured during read operations, and heat can be applied during write operations.

FIG. 3 is a graph showing the operational characteristics of the GST phase-changeable material used in the unit cells 10 and 20 shown FIGS. 1 and 2. Referring to FIG. 3, the reference numeral 1 denotes a characteristic curve representing a change of the GST phase-changeable material to an amorphous state, while the reference numeral 2 denotes a characteristic curve representing a change of the GST phase-changeable material to a crystalline state.

Referring to reference curve 1, the GST phase-changeable material can turn to its amorphous state by heating the GST phase-changeable material to a temperature higher than its melting point Tm using a controlled current for a time T1 and then quenching the temperature. The amorphous state, also known as the 'reset state', is used to store a data '1' within the GST phase-changeable material.

Referring next to reference curve 2, the GST phase-changeable material can turn to its crystalline state by heating it up to a temperature higher than its crystallization temperature Tc and lower than the melting temperature Tm using a controlled current for a time T2 (typically longer than T1) and then cooling GST phase-changeable material relatively slowly. The crystalline state is called the 'set state' and is used for storing a data '0'. Note that the resistance of the GST phase-changeable material is higher in the amorphous state than in the crystalline state.

A normal phase-changeable memory device having a plurality of memory cells can accept an external power source voltage VCC to precharge its bitlines BL and/or supply read current to the bitline BL. For read operations, a phage-changeable memory device generally employs a precharging circuit, a bias circuit, and a sense amplifier. The precharging circuit preliminarily charges the bitline BL up to the power source voltage VCC. The bias circuit supplies the read current to the bitline BL from the power source voltage VCC. The sense amplifier compares a voltage of a sensing node with a reference voltage, and reads data from the memory cell.

However, during a read operation a "sensing margin" of the sense amplifier can inadvertently be reduced or the power source voltage VCC can decrease below a predetermined voltage level (e.g., 1.5V). A sensing margin is the voltage difference between the reset and set states at the sensing node in a memory cell. For embodiments where the selection element uses an NMOS transistor (e.g., memory cell 10 of FIG. 1) and the power source voltage VCC is 1.5V, the sensing node is maintained at about 1.5V if the memory cell is configured in the reset state. However, the sensing node will be reduced from the power source voltage VCC to the ground level if the memory cell is configured in the set state.

On the other hand, in the case where a selection element of a memory cell is formed from a diode (e.g., memory cell 20 of FIG. 2), the sensing node will be maintain at about 1.5V when the memory cell 20 is maintained in the reset state, but the sensing node will be reduced to the threshold voltage of the diode when if the memory cell is configured to the set state. For this reason, the sensing margin of a phase-changeable memory device employing a diode D as a selection element is reduced by the threshold voltage of the diode D. The sensing margin is further reduced when the threshold voltage of the diode D rises due to factors arising from the diode's fabrication process.

Therefore, is can be advantageous to improve the sensing margin of phase-changeable memories that use diodes as selection elements during read operations.

SUMMARY OF THE INVENTION

The invention is directed to solve the aforementioned problems by providing a phase-changeable memory device and read method thereof by using a voltage pump to improve sensing margins.

In an illustrative embodiment, a phase-changeable memory device includes a memory cell connected to a bitline, a high voltage circuit adapted to generate a high voltage from a power source voltage, a precharging circuit adapted to charge the bitline to the power source voltage and further charge the bitline to the high voltage, a bias circuit adapted to provide a read current to the bitline with using the high voltage and a sense amplifier adapted to detect a voltage level of the bitline with using the high voltage.

In another illustrative embodiment, a method of reading data in a phase-changeable memory device includes discharging a bitline that is connected to a memory cell, charging the bitline with using a power source voltage, charging the bitline with using a high voltage after charging the bitline with using the power source voltage, providing a read current to the bitline with using the high voltage and sensing a voltage of the bitline with using the high voltage and reading data from the memory cell.

In yet another illustrative embodiment, a phase-changeable memory device includes a memory cell connected to a bitline, a precharging circuit charging the bitline to a precharging voltage, a bias circuit providing a read current to the bitline with using a high voltage larger than the precharging voltage, a sense amplifier detecting a voltage level of the bitline with using the high voltage and a high voltage circuit generating one of the precharging and high voltages from a power source voltage.

In still yet another illustrative embodiment, a method of reading data in a phase-changeable memory device includes discharging a bitline connected to a memory cell, precharging the bitline to a precharging voltage, providing a read current to the bitline with using a high voltage larger than the precharging voltage and sensing a voltage level of the bitline with using the high voltage and reading data from the memory cell.

A further understanding of the nature and advantages of the inventions herein may be realized by reference to the remaining portions of the specification and the attached drawings.

BRIEF DESCRIPTION OF THE FIGURES

Non-limiting embodiments of the present invention will be described with reference to the following figures, wherein like reference numerals refer to like parts throughout the various figures unless otherwise specified. In the figures.

DETAILED DESCRIPTION OF PREFERRED EMBODIMENTS

Preferred embodiments of the invention will be described below in more detail with reference to the accompanying drawings. The invention may, however, be embodied in different forms and should not be constructed as limited to the embodiments set forth herein. Rather, these embodiments are provided so that this disclosure will be thorough and complete, and will fully convey the scope of the invention to those skilled in the art.

Figure 1:
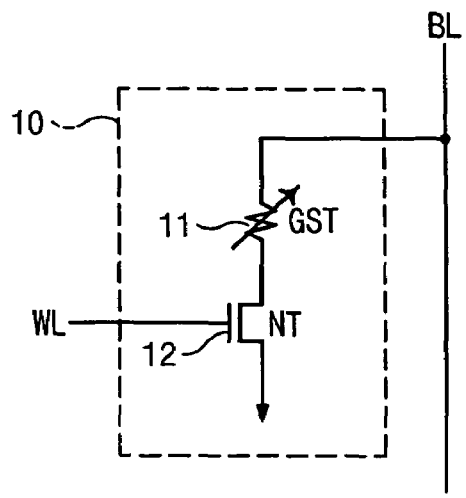
FIG. 1 is an equivalent circuit diagram showing a unit cell of a phase-changeable memory device.
Figure 2:
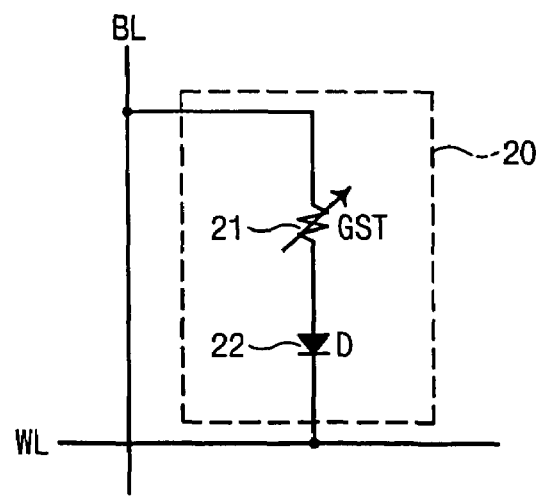
FIG. 2 is an equivalent circuit diagram showing a unit cell of another phase-changeable memory device.
Figure 3:
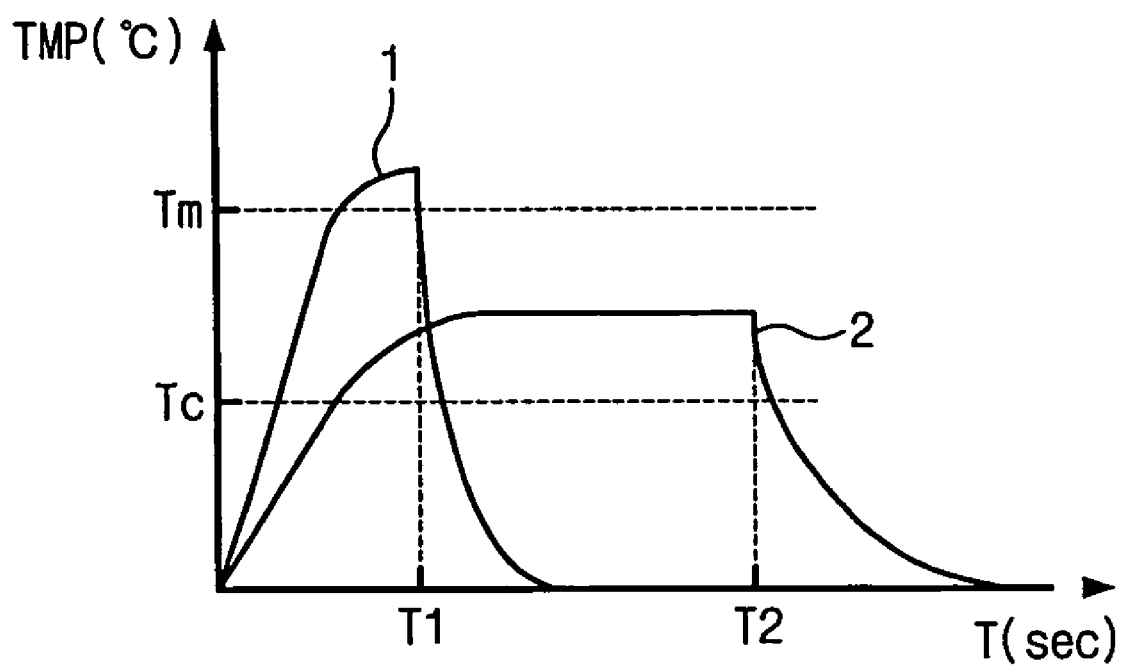
FIG. 3 is a graphic diagram showing an operational characteristic of a phase-changeable material.
Figure 4:
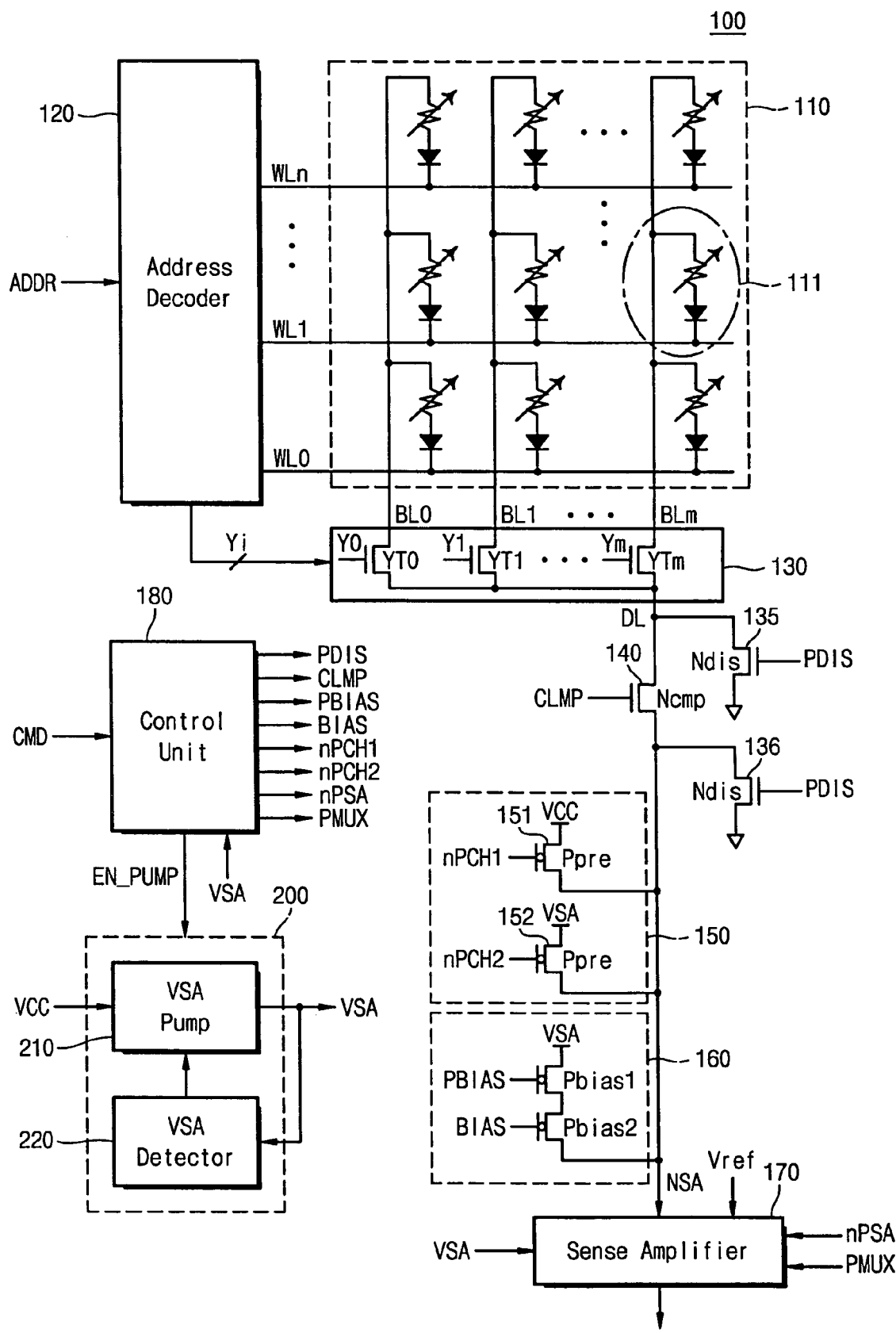
FIG. 4 is a block diagram illustrating a structural feature of a phase-changeable memory device in accordance with an illustrative embodiment of the invention.

FIG. 4 is a block diagram illustrating a structural feature of a phase-changeable memory device in accordance with an illustrative embodiment of the invention. As shown in FIG. 4, the phase-changeable memory device 100 includes a memory cell array 110, an address decoder 120, a bitline selection circuit 130, discharge circuits 135 and 136, a clamping circuit 140, a precharging circuit 150, a bias circuit 160, a sense amplifier 170, a control unit 180 and a high voltage circuit 200.

The memory cell array 110 is composed of plural memory cells. The plural memory cells are coupled with pluralities of wordlines WL0~WLn and bitlines BL0~BLm. Each memory cell can be formed of a memory element and a selection element. Each memory element includes a GST phase-changeable material and each selection element is made up with a diode. Note, however, that in other embodiments one can employ a transistor as the selection element instead of a diode.

In operation, the phase-changeable memory device 100 can supply a reset or set current to the memory cell in order to program the memory cell in the reset or set state. Note that the reset current is larger than the set current. Accordingly, when a transistor is used as the selection element, it is useful for the transistor to have a threshold voltage lower than that of a MOS transistor of the sense amplifier 170 used to program the memory cell.

The address decoder 120 can operate to decode an address ADDR input from the external to select the wordlines and bitlines. The address ADDR is differentiated into a row address RA for selecting the wordlines WL0~WLn and a column address CA for selecting the bitlines BL0~BLm.

In FIG. 4, wordline WL1 and the bitline BLm are designated respectively among the plural wordlines WL0~WLn and the bitlines BL0~BLm. By designating wordline WL1 and bitline BLm, memory cell 111 can be selected in the memory cell array 110.

The bitline selection circuit 130 can select a bitline in response to a selection signal Yi (i=0~m) provided from the address decoder 120. The bitline selection circuit 130 includes pluralities of NMOS transistor YT0~YTm. The plural NMOS transistors YT0~YTm can connect to the bitlines BL0~BLm with a data line DL. For instance, when the selection signal Ym is activated, bitline BLm can be electrically connected to the data line DL.

The first discharge circuit 135 is connected between the data line DL and the ground terminal and can discharge the data line DL. The first discharge circuit 136 is also connected between a sensing node NSA and the ground terminal and can discharge the sensing node NSA. Referring to FIG. 4, the first discharge circuit 135 is composed of an NMOS transistor Ndis forming a current path between the data line DL and the ground terminal, and in operation can discharge the data line DL in response to a discharge signal PDIS. Additionally, the second discharge circuit 136 can discharge the sensing node NSA in response to the discharge signal PDIS, which is provided from the control unit 180.

The clamping circuit 140 regulates the data line DL under a predetermined voltage level during a read operation. The purpose of this clamping operation is to restrict a voltage of the selected bitline BLm to not exceed a threshold voltage of the phase-changeable material. In other words, the voltage across the phase-changeable material must be controlled so as not to be higher than the threshold voltage. For instance, assuming that the diode and the phase-changeable material are designed with threshold voltages of 0.5V and 1V respectively, the selected bitline BLm will be regulated to a voltage less than 1.5V, i.e., at about 1V.

Referring again to FIG. 4, the clamping circuit 140 can be composed of an NMOS transistor Ncmp forming a current path between the sensing node NSA and the data line DL, and can serve to restrict the voltage level of the data line DL in response to a clamp signal CLMP. For example, assuming that a threshold voltage of the NMOS transistor Ncmp is 1V and the clamp signal CLMP is set on 2V, the data line DL will be clamped to a maximum of about 1V. Simultaneously, the selected bitline BLm also may be similarly regulated. The clamp signal CLMP is provided from the control unit 180 and can have a constant DC voltage level during read operations.

The precharging circuit 150 can charge the sensing node NSA to the voltage level of the power source voltage VCC and then raise the sensing node NSA up to the level of a high voltage VSA. During this process, the selected bitline BLm can be precharged to the clamping voltage (e.g., 1V). Again referring to FIG. 4, the precharging circuit 150 can include a first and second precharging circuits 151 and 152. The first precharging circuit 151 can initially charge the sensing node NSA up to the power source voltage VCC in response to a first precharging signal nPCH1, while the second precharging circuit 152 can initially charge the sensing node NSA up to the high voltage VSA in response to a second precharging signal nPCH2. The first and second precharging signals nPCH1 and nPCH2 are provided from the control unit 180.

The first precharging circuit 151 is connected between a first power terminal and the sensing node NSA. In operation, the first precharging circuit 151 can receive the power source voltage VCC through the first power terminal and precharge the sensing node NSA up to the power source voltage VCC in response to the first precharging signal nPCH1. As shown in FIG. 4, the first precharging circuit 151 is composed of a PMOS transistor Ppre. The PMOS transistor Ppre of the first precharging circuit 151 is configured such that its gate receives the first precharging signal nPCH1, its source is connected to the power source voltage VCC and its drain is connected to the sensing node NSA. While not explicitly shown in FIG. 4, the bulk of the PMOS transistor Ppre is boosted by the high voltage VSA.

The second precharging circuit 152 is connected between a second power terminal and the sensing node NSA, and is configured to receive the high voltage VSA through the second power terminal and precharge the sensing node NSA up to the high voltage VSA in response to the second precharging signal nPCH2. As shown in FIG. 4, the second precharging circuit 152 is composed of a PMOS transistor Ppre much like the first precharging circuit 151. The PMOS transistor Ppre of the second precharging circuit 152 is configured such that its gate can receive the second precharging signal nPCH2, its source is connected to the high voltage VSA, its drain is connected to the sensing node NSA and its bulk is boosted by the high voltage VSA.

If the precharging circuit 150 is designed to operate only with the high voltage VSA, the high voltage circuit 200 can have an excessive capacitive burden when having to precharge an excessive number of bitlines during a burst read operation. Further, during a precharging operation, the high voltage circuit 200 may have to bear an excessively large precharging burden because each bitline may have a large capacitance.

In order to lower the burden on the high voltage circuit 200 while precharging the bitlines, the precharging circuit 150 can conduct the precharging operation in two sequential steps. In the first precharging step, the selected bitline BLm can be charged up to the level of the power source voltage VCC. During this step, the first precharging circuit 151 can perform the precharging operation using the externally supplied power source voltage VCC. In the second precharging step, the selected bitline BLm can further rise up to the level of the high voltage VSA. During this step, the second precharging circuit 152 can perform the precharging operation with the high voltage VSA that is provided from the high voltage circuit 200.

As was previously mentioned, the precharging circuit 150 can boosts the sensing node NSA up to the high voltage VSA from the power source voltage VCC during the second precharging step. Note that it can be advantageous that the high voltage circuit 200 supply the high voltage VSA to the precharging circuit 150 only during the second precharging step. Thus, the phase-changeable memory device 100 can be benefited by the reduction of the capacitive burden of the high voltage circuit 200 during the precharging operation while offering a sufficient sensing margin to the sense amplifier 170 during a sensing operation. This will later be described with further detail with reference to FIG. 5.

Meanwhile, the bias circuit 160 can be connected between a power terminal of the high voltage VSA and the sensing node NSA and can supply a read current to the selected bitline BLm. As shown in FIG. 4, the bias circuit 160 is composed of two PMOS transistors Pbias1 and Pbias2, and can accept the high voltage VSA through the power terminal.

The first PMOS transistor Pbias1 is connected between the power terminal and the second PMOS transistor Pbias2 and can be controlled by a first biasing signal PBIAS. The second PMOS transistor Pbias2 is connected between the first PMOS transistor Pbias1 and the sensing node NSA and can be controlled by a second biasing signal BIAS. The second biasing signal BIAS can be supplied from the control unit 180 and be set to a predetermined DC voltage level during the read operation. The bias circuit 160 can supply a read current to the selected bitline BLm when the first biasing signal PBIAS is set on low voltage level.

The sense amplifier 170 can compare a voltage of the sensing node NSA with a reference voltage Vref during the read operation to produce output a sensing result SAO. The reference voltage Vref can be supplied from a reference voltage generator (not shown). The sense amplifier 170 can conduct its sensing operation using the high voltage VSA. During the sensing operation, the sense amplifier 170 can receive control signals nPSA and PMUX from the control unit 180.

Note that the structure and operation of the sense amplifier 170 will be described in further detail with reference to FIGS. 6 and 7.

The control unit 180 can output control signals PDIS, CLMP, PBIAS, BIAS, nPCH1, nPCH2, nPSA, PMUX, and EU_PUMP in response to a command CMD provided from an external source. The pumping enable signal EN_PUMP can be applied to the high voltage circuit 200. Operational features of the control signals output from the control unit 180 will be described in further detail with reference to FIGS. 5 and 7.

The high voltage circuit 200 includes a voltage pump 210 and a detector 220. In operation, the voltage pump 210 can boost the level of the power source voltage VCC by way of a charge pumping mechanism. The detector 220 in turn can sense whether the output voltage of the voltage pump 210 reaches the level of the high voltage VSA. When the output voltage of the voltage pump 210 reaches the high voltage VSA, the detector 220 can disable the voltage pump 210. Unless the output voltage of the voltage pump 210 reaches the high voltage VSA, the detector 220 can continue to enable the voltage pump 210 to boost the power source voltage VCC. Note that the high voltage VSA can be supplied to the precharging circuit 150, the bias circuit 160 and the sense amplifier 170.

Figure 5:
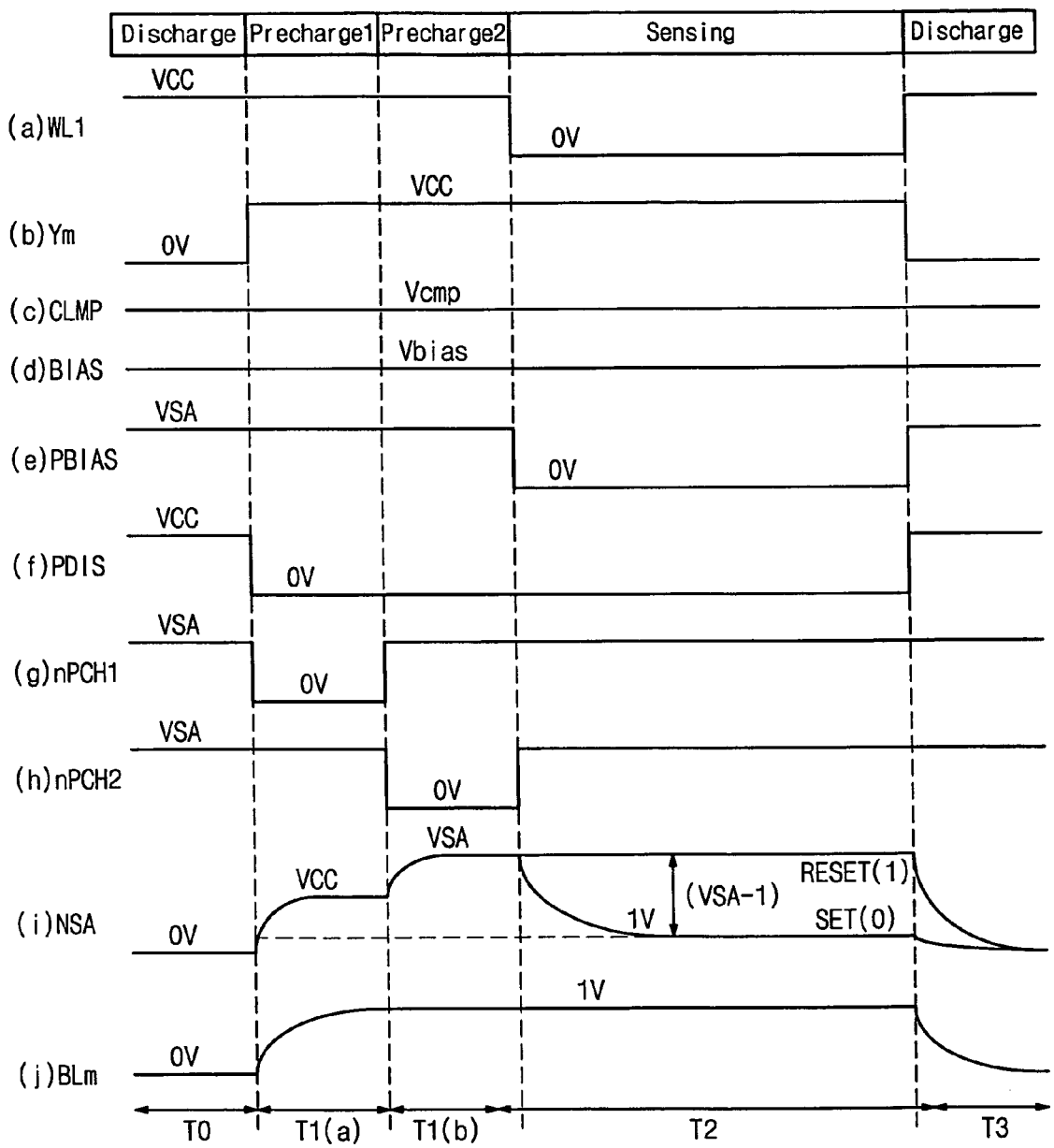
FIG. 5 is a timing diagram explaining an operation of the phase-changeable memory device shown in FIG. 4.

FIG. 5 is a timing diagram depicting an operation of the phase-changeable memory device 100 shown in FIG. 4. As shown in FIG. 5, the operation is described with regard to a read operation having sequential periods of discharging T0, first precharging T1($a$), second precharging T1($b$), sensing T2, and discharging T3. For convenience of description, the read operation is carried out for the memory cell 111 of FIG. 4 as an example.

In the discharging period T0, the data line NSA and the sensing node NSA are discharged to the ground voltage level. As shown in FIG. 5, as the selection signal Ym is maintained at a low level, the selected bitline BLm can be electrically disconnected with the data line DL. Further, as the discharge signal PDIS is set to a high level, the data line DL and the sensing node NSA are discharged to the ground voltage level. As the first biasing signal PBIAS is set to a high level, the first PMOS transistor Pbias1 of the bias circuit 160 can be turned off. One purpose of holding the selected bitline BLm on the ground level is to prevent the bitline BLm from being discharged by a bitline discharging circuit (not shown) disposed on the bitline BLm.

In the first precharging period T1($a$), the sensing node NSA is precharged to the power source voltage VCC and the selected bitline BLm rises up to the clamping voltage (e.g., 1V). Further, the selection signal Ym rises to a high level while the discharge signal PDIS sinks to low level. The first precharging signal nPCH1 also sinks to low level. When the selection signal Ym rises to a high level, the bitline BLm can be electrically connected with the data line DL. When the discharge signal PDIS sinks to a low level, the NMOS transistors Ndis of the discharging circuits 135 and 136 can be turned off. When the first precharging signal nPCH1 sinks to a low level, the sensing node NSA is precharged to the power source voltage VCC. If the sensing node NSA is charged up to the power source voltage VCC, the voltage of the selected bitline BLm rises up toward the clamping voltage 1V.

In the second precharging period T1($b$), the second precharging signal nPCH2 sinks to a low level. Responding to this low level of the second precharging signal nPCH2, the sensing node NSA is further charged to the high voltage VSA. If the sensing node NSA is charged up to the high voltage VSA, the selected bitline BLm will rise to the clamping voltage 1V.

In the sensing period T2, the selected wordline WL1 is set to a low voltage level. When the wordline WL1 becomes low level, a voltage level of the sensing node NSA is variably dependent on the state of the memory cell 111. During the sensing period T2, the first bias signal PBIAS is reduced to a low level. From the transition of the first bias signal PBIAS to this low level, a read current can flow into the selected memory cell 111 through the bias circuit 160.

If the selected memory cell 111 is conditioned in the reset state, i.e., storing data '1', the sensing node NSA can retain the high voltage VSA. Note that the sensing node NSA is able to retain the high voltage VSA because the read current is being supplied via the bias circuit 160.

If the selected memory cell 111 is conditioned in the set state, i.e., storing data '0', the voltage level of the sensing node NSA will fall down toward 1V from the high voltage VSA. During this time, the voltage level of the sensing node NSA will not go to the ground level GND but to 1V owing to the threshold voltage of the diode. During period T2, the sense amplifier 170 can be activated to conduct its sensing operation. The sensing operation by the sense amplifier 170 will be further described with reference to FIGS. 6 and 7.

In the discharging period T3, the selected wordline WL1 is set to a high level. The selection signal Ym sinks to a low level while the discharge signal PDIS rises to a high level. Responding to the low level of the selection signal, the selected bitline BLm can be electrically disconnected with the data line DL. Responding to the high level of the discharge signal PDIS, the sensing node NSA can be discharged to the ground level.

In the case of the conventional phase-changeable memory device, a sensing margin of the sensing node NSA is no more than VCC−1V. Thus, if the power source voltage VCC is lowered under 1.5V, the sensing margin is reduced to less than 0.5V. This drop of sensing margin acts to heavy degrade read operation performance. However, as shown in FIG. 5, the phase-changeable memory device has a sufficient sensing margin at the sending node NSA, i.e., VSA−1V, which assures a stable read operation.

Moreover, according to the phase-changeable memory device. 100 according to the invention, since the precharging operation is carried out through two steps with using the power source voltage VCC and the high voltage VSA, the capacitive burden of the high voltage circuit 200 during the precharging operation is lessened.

Figure 6:
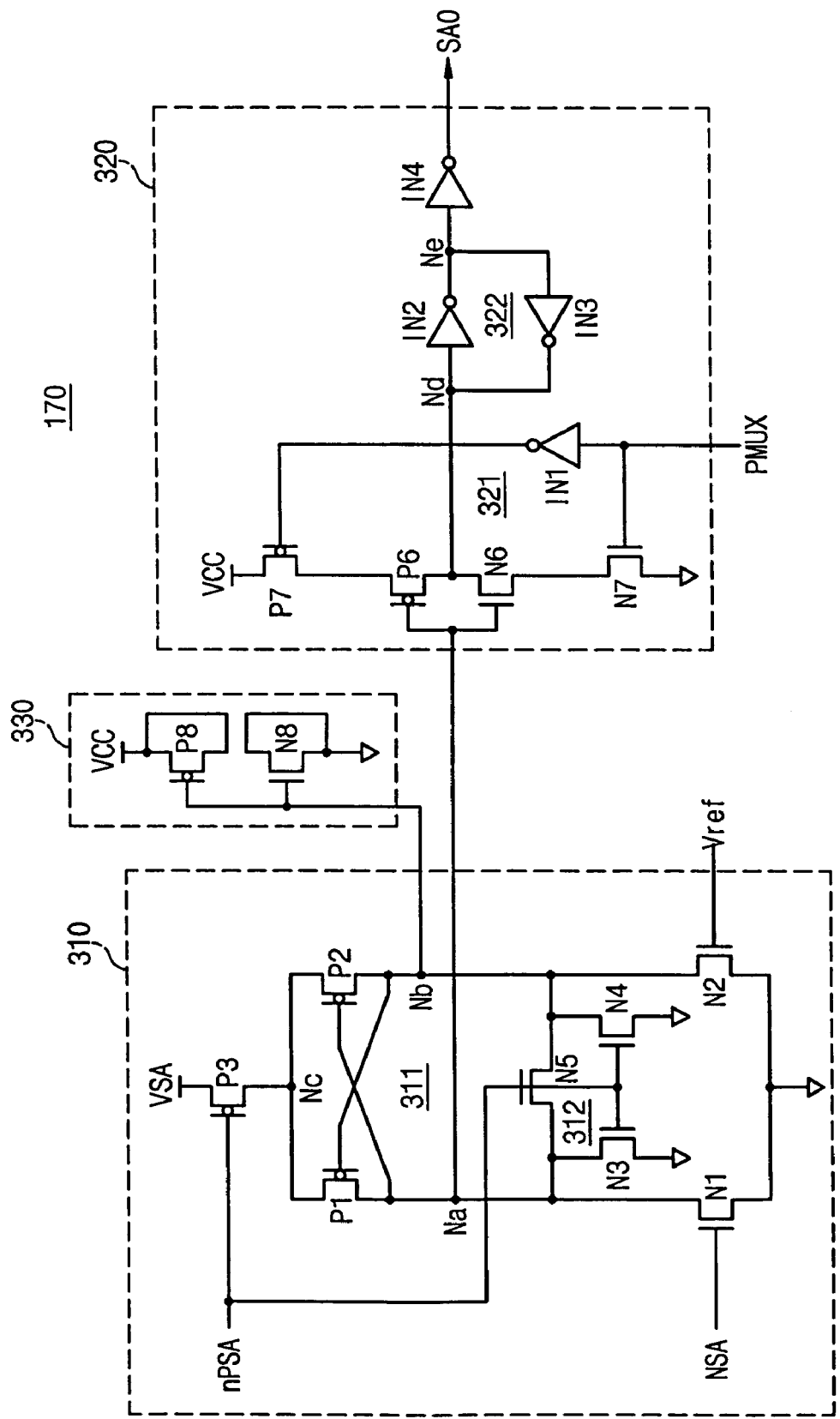
FIG. 6 is a circuit diagram illustrating the sense amplifier shown in FIG. 5.

FIG. 6 is a circuit diagram illustrating the sense amplifier shown in FIG. 5. The sense amplifier 170 outputs the sensing result SAO based on a comparison of a voltage of the sensing node NSA and the reference voltage Vref. The sense amplifier 170, which receives the high voltage VSA, can conduct the sensing operation in response to the control signals nPSA and PMUX. As shown in FIG. 6, the sense amplifier 170 includes a sensing circuit 310, a latch circuit 320 and a dummy latch circuit 330.

The sensing circuit 310 includes a plurality of PMOS transistors P1~P3 and a plurality of NMOS transistors N1~N5. The sensing circuit 310 is composed of a differential amplifier 311 and an equalizer 312. In operation, the differential amplifier 311, which uses the high voltage VSA, can sense and amplify the difference between the reference voltage Vref and a voltage of the sensing node NSA. The equalizer 312 forces output nodes Na and Nb of the differential amplifier to be equal with each other in voltage level.

The differential amplifier 311 is composed of a first and second NMOS transistor N1 and N2, and a first, second and third PMOS transistor P1, P2, and P3. The first NMOS transistor N1 forms a current path between the first node Na and the ground in response to a voltage of the sensing node NSA. The second NMOS transistor N2 forms a current path between the second node Nb and the ground in response to the reference voltage Vref. The first PMOS transistor P1 forms a current path between the third node Nc and the first node Na in response to a voltage of the second node Nb. The second PMOS transistor P2 forms a current path between the third node Nc and the second node Nb in response to a voltage of the first node Na. The third PMOS transistor P3 forms a current path between the power terminal of VSA and the third node Nc in response to the control signal nPSA. The third PMOS transistor P3 accepts the high voltage VSA through the power terminal.

The equalizer 312 is composed of a third, fourth and fifth NMOS transistor N3, N4, and N5. The third NMOS transistor N3 is connected between the first node Na and the ground. The fourth NMOS transistor N4 is connected between the second node Nb and the ground. The fifth NMOS transistor N5 is connected between the first node Na and the second node Nb. The third through fifth NMOS transistors N3-N5 can be simultaneously turned on or off in response to the control signal nPSA.

The latch circuit 320, which is connected to the first node Na of the sensing circuit 310, can output the sensing result SAO in response to the control signal PMUX. The latch circuit 320 includes an inversion circuit 321 and a latch 322. The inversion circuit 321 is connected between the first and fourth nodes Na and Nd, and operates in response to the control signal PMUX. The inversion circuit 321 is composed of a sixth and seventh PMOS transistor P6 and P7, a sixth and seventh NMOS transistor N6 and N7, and a first inverter IN1. When the control signal PMUX is raised to a high level, the inversion circuit 321 can output an inverse signal from a voltage level of the first node Na. The latch 322 includes second and third inverters IN2 and IN3.

The dummy latch circuit 330 is connected to the second node Nb of the sensing circuit 310. The dummy latch circuit 330 includes an eighth PMOS transistor P8 and an eighth NMOS transistor N8. In the eighth PMOS transistor P8, its drain and source are coupled with each other and its gate is coupled to the second node Nb. The eighth PMOS transistor P8 accepts the power source voltage VCC through the source terminal. The source and drain of the eighth NMOS transistor N8, are coupled with each other, and the respective gate is coupled to the second node Nb. The source of the eighth NMOS N8 is connected to the ground terminal. Here, it should be noticed that the drains of the eighth PMOS and NMOS transistors P8 and N8 are disconnected with each other. The dummy latch circuit 330 is provided to equalize loadings against the first and second nodes Na and Nb.

Figure 7:
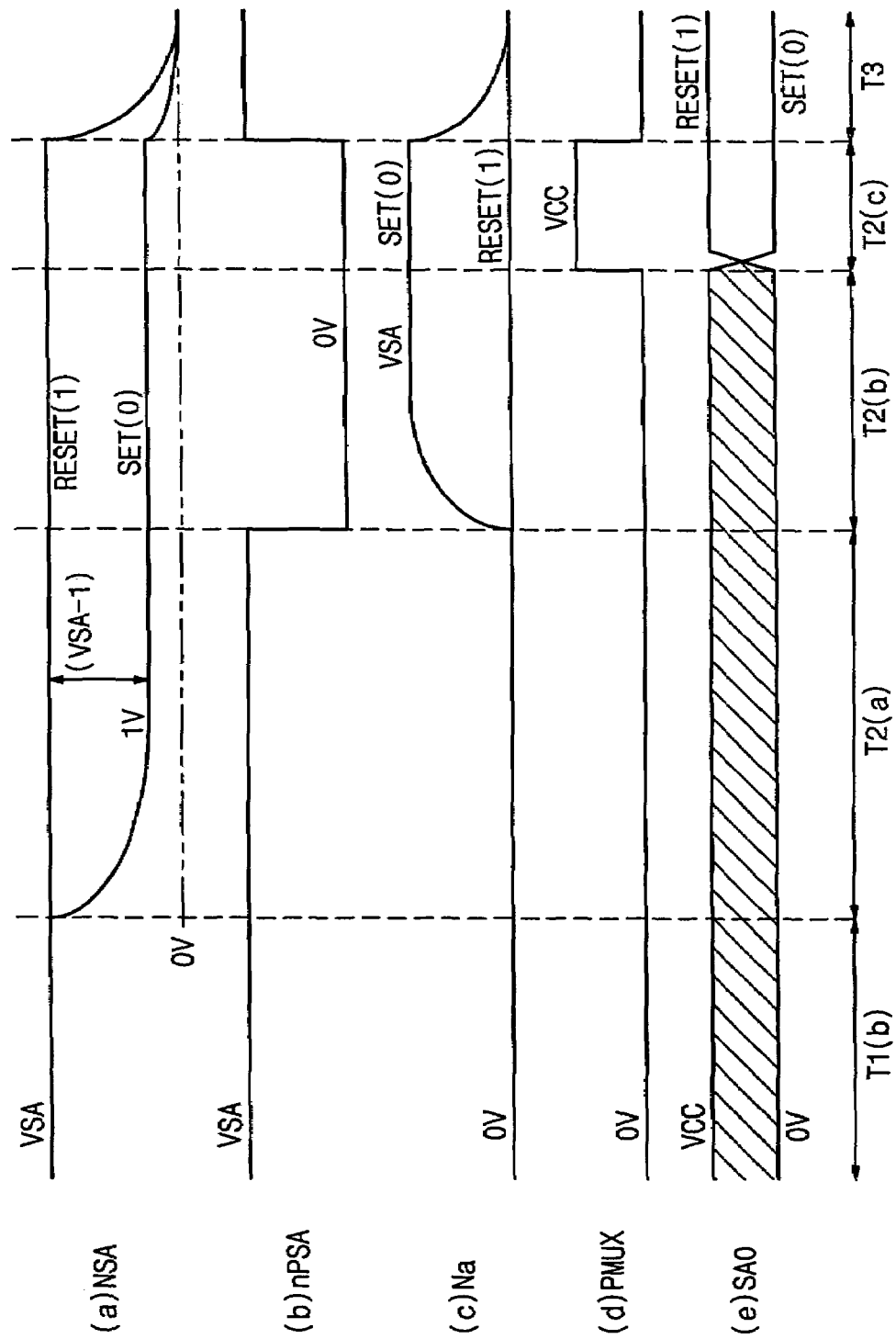
FIG. 7 is a timing diagram explaining an operation of the sense amplifier shown in FIG. 6.

FIG. 7 is a timing diagram further explaining the operation of the sense amplifier shown in FIG. 6. More particularly, FIG. 7 will provide details about the operation of the sense amplifier 170 in the sensing period T2. The voltage level of the sensing node NSA shown in FIG. 7 is same with that shown in FIG. 5.

During the first sensing period T1(b), the first control signal nPSA is set at the high voltage VSA and the second control signal PMUX is set at low level. As the first control signal nPSA is at the high voltage VSA, the first and second nodes Na and Nb are held at the ground voltage level.

In a first sensing period T2(a), a voltage level of the sensing node NSA is variable as a function of the state of the selected memory cell 111. The sensing node NSA retains the high voltage VSA when the memory cell 111 is in the reset state, but will go down to 1V if the memory cell 111 is in the set state.

In the second sensing period T2(b), the first control signal nPSA turns to the ground voltage GND. As shown in FIG. 6, the third PMOS transistor P3 is turned on while the third through fifth NMOS transistors N3-N5 are turned off. During this time, the sense circuit 310 can conduct the sensing operation by comparing a voltage of the sensing node-NSA to the reference voltage Vref. If the voltage of the sensing node NSA is higher than the reference voltage Vref, the first node Na goes to the ground voltage. If the voltage of the sensing node NSA is lower than the reference voltage Vref, the first node Na goes to the high voltage VSA. In other words, the first node Na lowers to the ground voltage when the selected memory cell 111 is conditioned in the reset state, but will raise to the high voltage VSA when the selected memory cell 111 is conditioned in the set state.

In a third sensing period T2(c), the second control signal PMUX is activated. Responding to the activation of the second control signal, the latch circuit 320 inverts the voltage level of the first node Na and outputs the sensing result SAO. As shown in FIG. 7, the output node of the sense amplifier 170 is held in the previous state until the end of the second sensing period T2(b). During the third sensing period T2(c), the output node of the sense amplifier 170 will change to either the power source voltage VCC or the ground voltage GND in response to the control signal PMUX. That is, when the first node Na is charged up to the high voltage VSA, the output voltage SAO (i.e., the sensing result) lowers to the ground voltage GND. However, when the first node Na is set on the ground voltage GND, the output voltage SAO rises to the level of the power source voltage VCC.

In the discharging period T3, the first control signal nPSA rises to the high voltage VSA and the second control signal PMUX lowers to the ground voltage GND. Referring to FIG. 6, the third PMOS transistor P3 of the sensing circuit 310 is turned off while the third through fifth NMOS transistors N3-N5 are turned on. During this time, the first and second nodes Na and Nb are discharged to the ground voltage GND, and the latch 322 will hold the current voltage level of the output node.

Figure 8:
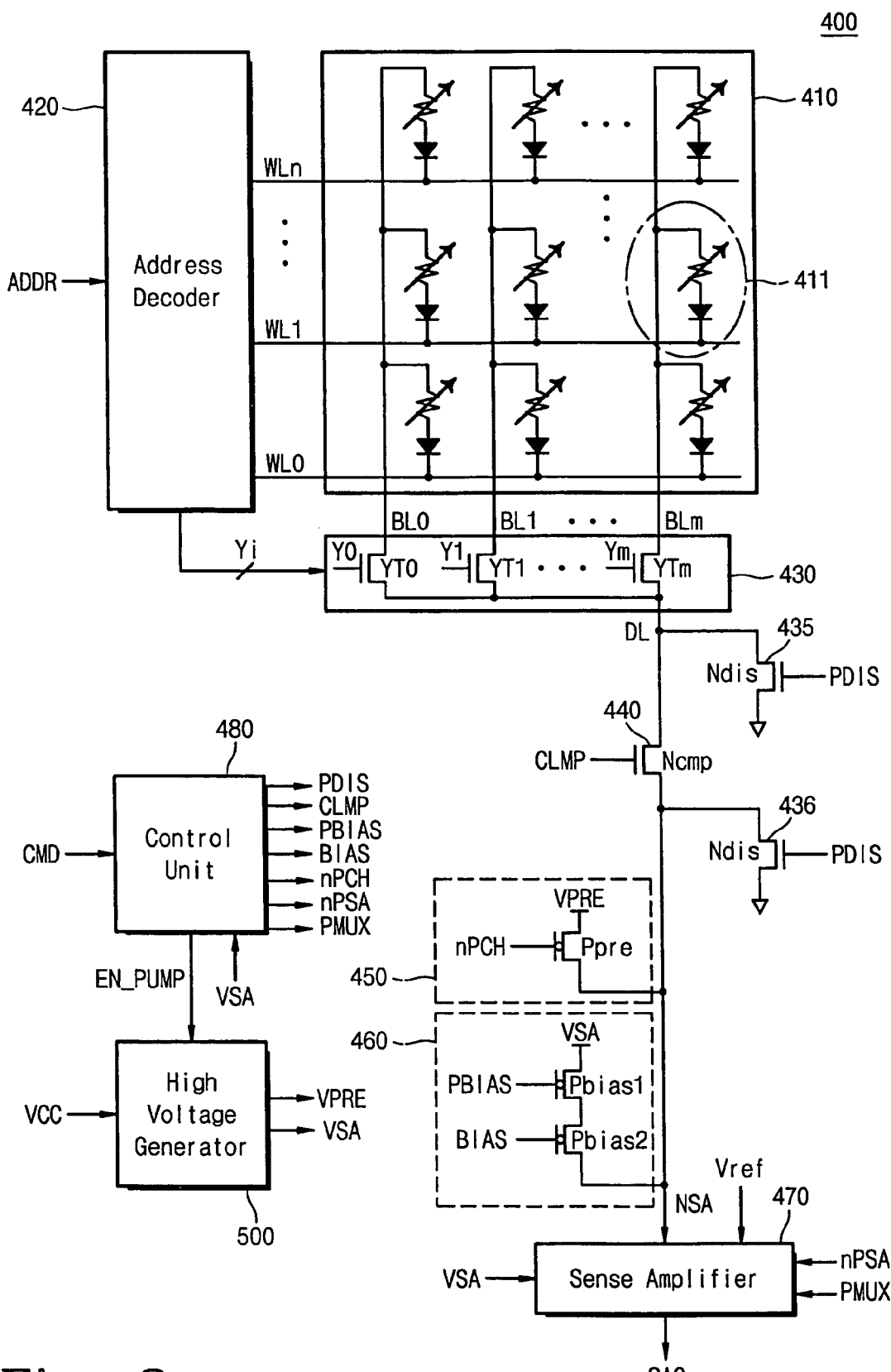
FIG. 8 is a block diagram illustrating a structural feature of a phase-changeable memory device in accordance with another illustrative embodiment of the invention.

FIG. 8 is a block diagram illustrating a structural feature of a phase-changeable memory device in accordance with a second embodiment of the invention. As shown in FIG. 8, the phase-changeable memory device 400 is comprised of a memory cell array 410, an address decoder 420, a bitline selection circuit 430, discharging circuits 435 and 436, a clamping circuit 440, a precharging circuit 450, a bias circuit 460, a sense amplifier 470, a control unit 480 and a high voltage circuit 500. The phase-changeable memory device 400 shown in FIG. 8 is same with that of FIG. 4 in structure and operation, except for the precharging circuit 450.

The precharging circuit 450 preliminarily sets the sensing node NSA on a precharging voltage VPRE before the sensing operation of the sense amplifier 470. During this time, the selected bitline BLm is precharged up to the clamping voltage (e.g., 1V). The precharging circuit 450 is connected between the power terminal and the sensing node NSA, accepts the precharging voltage VPRE through the power terminal and precharges the sensing node NSA to the precharging voltage VPRE in response to a precharging signal nPCH. The precharging signal nPCH is provided from the control unit 480.

Referring to FIG. 8, the precharging circuit 450 is composed of a PMOS transistor Ppre. The PMOS transistor Ppre is formed of a gate to which the precharging signal. nPCH is applied, a source connected to the precharging voltage VPRE and a drain connected to the sensing node NSA. The bulk (not shown) of PMOS transistor Ppre is boosted by the high voltage VSA.

The precharging voltage VPRE is supplied from the high voltage circuit 500. The precharging voltage VPRE is generated independent of the high voltage VSA that is to be applied to the bias circuit 460 and the sense amplifier 470, which is lower than the high voltage VSA. The reason of lowering the precharging voltage VPRE under the high voltage VSA is to lessen the capacitive burden of the high voltage circuit 500.

Assuming that the precharging circuit 450 uses the high voltage VSA, the high voltage circuit 500 can be used to generate the high voltage VSA for precharging the bitline BL. However, since the bitline BL has a large loading capacity, it is inevitable for the high voltage circuit 500 will have a lot of capacitive burden in generating the high voltage VSA during the precharging period.

In order to lessen such a capacitive burden of the high-voltage circuit 500, the precharging circuit 450 can charge the selected bitline BLm by using the precharging voltage VPRE instead of the high voltage VSA. Here, the precharging circuit 450 is able to use either the power source voltage VCC (which is externally provided) or the reference voltage Vref (provided from the sense amplifier 470) as the precharging voltage VPRE.

When the precharging voltage VPRE is lower than the high voltage VSA, a voltage level of the sensing node NSA is different from the conventional case during the sensing operation. That is, the sensing node NSA rises to the high voltage VSA from the precharging voltage VPRE when the selected memory cell 111 is in the reset state. When the selected memory cell 111 is in the set state, the sensing node NSA lowers to 1V from the precharging voltage VPRE. This means that it is possible to assure a sufficient sensing margin in the sensing operation while reducing the capacitive burden of the high voltage circuit 500 during the precharging operation. The precharging mechanism with the precharging voltage VPRE will be more detailed in conjunction with FIG. 9.

Figure 9:
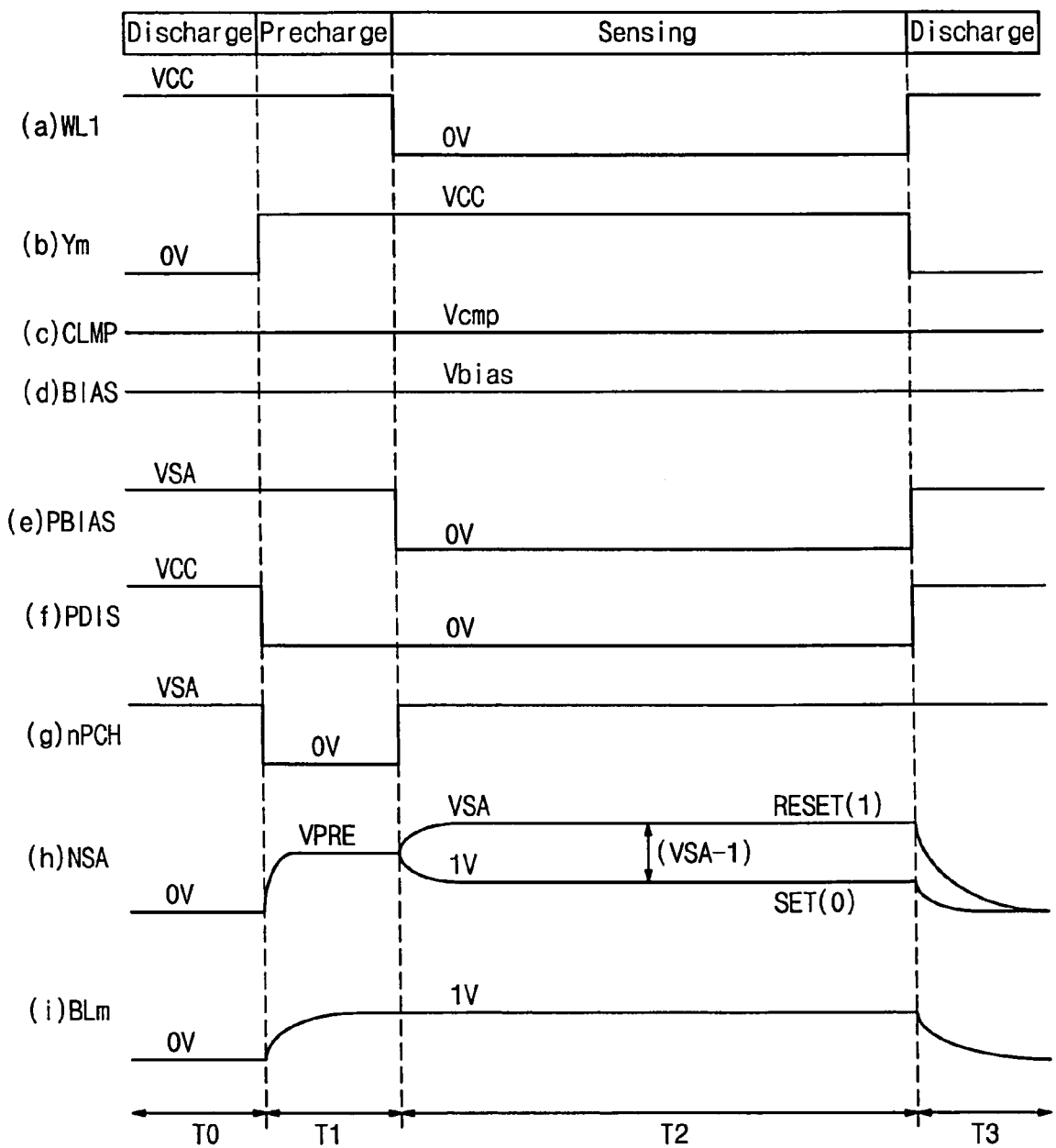
FIG. 9 is a timing diagram explaining an operation of the phase-changeable memory device shown in FIG. 8.

FIG. 9 is a timing diagram explaining an operation of the phase-changeable memory device 400 shown in FIG. 8. Referring to FIG. 9, a read operation of the phase-changeable memory device 400 is carried out through sequential periods of discharging T0, precharging T1, sensing T2, and discharging T3. The discharging periods T0 and T3 are same with those shown in FIG. 5.

In the precharging period T1, the sensing node NSA is set to the precharging voltage VPRE and the selected bitline BLm are precharged to the clamping voltage 1V. As shown in FIG. 9, the selection signal Ym rises to the high level and the discharge signal PDIS drops to a low level. The precharging signal nPCH also drops to a low level. When the selection signal Ym reaches a high level, the bitline BLm is electrically connected with the data line DL. When the discharge signal PDIS reaches a low level, the NMOS transistors Ndis of the discharging circuits 435 and 436 are turned off. When the precharging signal nPCH drops to a low level, the sensing node NSA is precharged up to the precharging voltage VPRE. If the sensing node NSA is charged up to the precharging voltage VPRE, a voltage of the selected bitline BLm rises to the clamping voltage 1V.

In the sensing period T2, the selected wordline WL1 is set to a low voltage level. When the wordline WL1 reaches a low level, a voltage level of the sensing node NSA is variable dependent on a state of the selected memory cell 411. During the sensing period T2, the first bias signal PBIAS is held at the low level. As the first bias signal PBIAS transitions to a low level, a read current can flow into the selected memory cell 411 through the bias circuit 460.

If the selected memory cell 411 is conditioned in the reset state, i.e., stores data '1', the sensing node NSA can be charged up to the high voltage VSA from the precharging voltage VPRE. The voltage of the sensing node NSA is able to rise to the high voltage VSA because the read current is being supplied to thereto through the bias circuit 460. Otherwise, If the selected memory cell 411 is conditioned in the set state. i.e., stores data '0', the voltage level of the sensing node NSA falls toward 1V from the precharging voltage VPRE. During this time, the voltage level of the sensing node NSA does not go to the ground level GND but to 1V due to the threshold voltage of the memory cell's diode. In the period T2, the sense amplifier 470 is activated to conduct its sensing operation.

Figure 10:
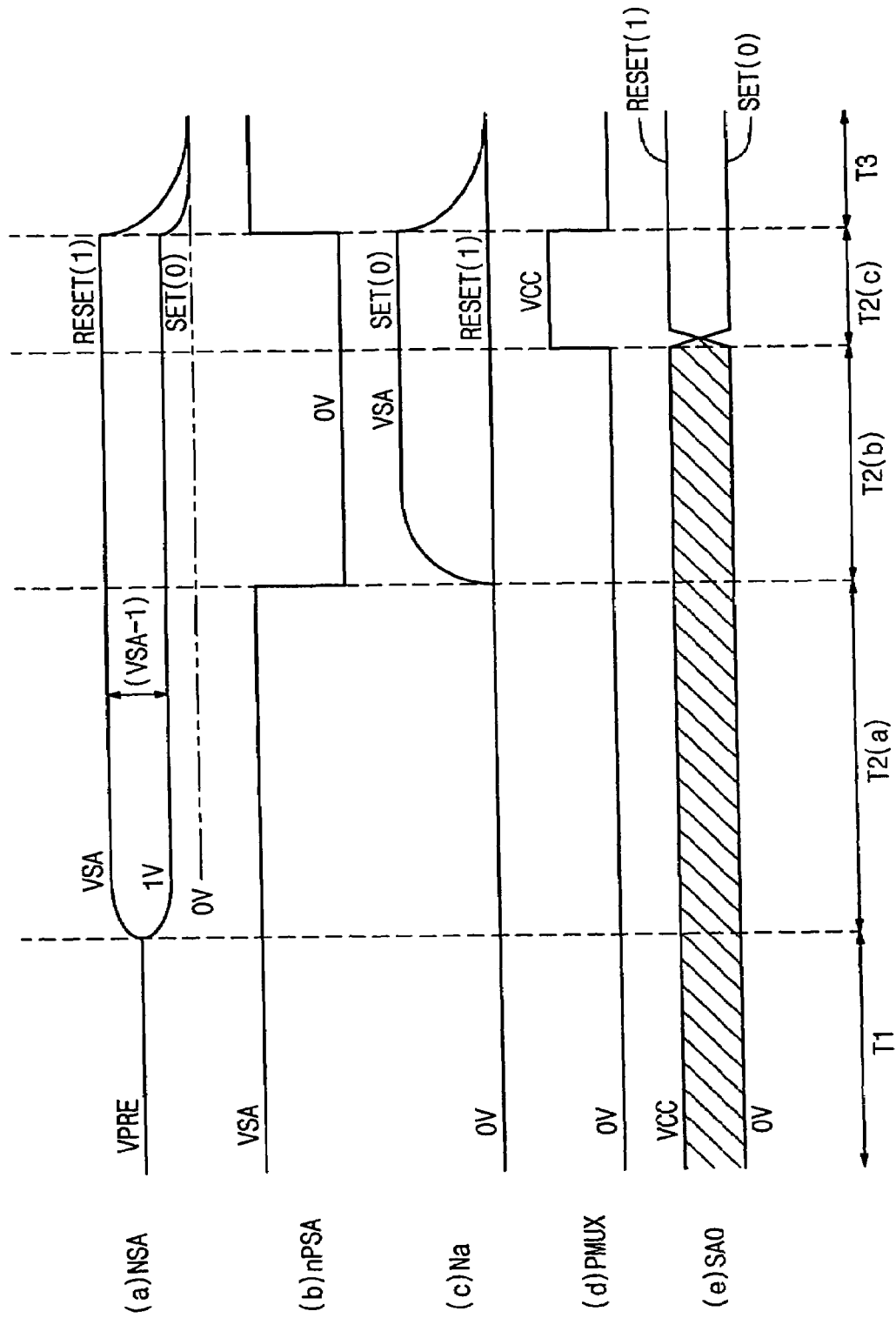
FIG. 10 is a timing diagram explaining an operation of the sense amplifier shown in FIG. 8.

FIG. 10 is a timing diagram further explaining an operation of the sense amplifier shown in FIG. 8. In a first sensing period T2(a), a voltage level of the sensing node NSA is variable dependent on a state of the selected memory cell 411. The sensing node NSA rises to the high voltage VSA when the memory cell 411 is conditioned in the reset state. On the other hand, when the memory cell 411 is conditioned in the set state, the sensing node NSA drops to 1V. Other features of the sensing operation in FIG. 10 are same with those shown in FIG. 7.

In the case of the conventional phase-changeable memory device, a sensing margin of the sensing node NSA is no more than VCC−1V. Thus, if the power source voltage VCC is lowered to below 1.5V, the sensing margin drops to below 0.5V. This drop of sensing margin acts to degrade the reliability of read operations in the phase-changeable memory device. However, as can be seen from FIG. 9, the phase-changeable memory device 400 has a sufficient sensing margin at the sending node NSA, i.e., VSA−1V, which assures a stable read operation.

Further, according to the phase-changeable memory device 400 according to the invention, since the precharging operation for the bitline is carried out with using the precharging voltage VPRE lower than the high voltage VSA, it lessens the capacitive burden of the high voltage circuit 500 during the precharging operation.

As described above, it is advantageous to lessen the capacitive burden on the phase-changeable memory device's high voltage circuit during the precharging operation while providing a sufficient sensing margin during the sensing operation, in order to assures a stable read operation.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A phase-changeable memory device comprising:
a memory cell connected to a bitline;
a high voltage circuit adapted to generate a high voltage from an externally provided power source voltage, wherein the high voltage is higher than the power source voltage;
a precharging circuit adapted to charge the bitline to the power source voltage and further charge the bitline to the high voltage;
a bias circuit adapted to provide a read current to the bitline with using the high voltage; and
a sense amplifier adapted to detect a voltage level of the bitline with using the high voltage.

2. The phase-changeable memory device as set forth in claim 1, wherein the memory cell comprises:
a memory element containing a phase-changeable material; and
a selection element adapted to select the memory cell, wherein the selection element is a diode connected between the memory element and a wordline.

3. The phase-changeable memory device as set forth in claim 1, wherein the high voltage circuit comprises:
a voltage pump adapted to boost the power source voltage; and
a detector adapted to sense an output voltage level of the voltage pump and regulate the voltage pump.

4. The phase-changeable memory device as set forth in claim 1, wherein the precharging circuit comprises:
a first precharging circuit adapted to charge the bitline to the power source voltage; and
a second precharging circuit adapted to charge the bitline to the high voltage.

5. The phase-changeable memory device as set forth in claim 1, wherein the sense amplifier is adapted to compare a voltage of the bitline with a reference voltage, and further adapted to read data from the memory cell.

6. The phase-changeable memory device as set forth in claim 1, further comprising:
a clamping circuit connected between the bitline and a sensing node and adapted to regulate a voltage of the bitline,
wherein the sensing node is connected to the precharging and bias circuits.

7. The phase-changeable memory device as set forth in claim 6, wherein the precharging circuit comprises:
a first precharging circuit connected between a first power terminal and the sensing node, the first precharging circuit adapted to accept the power source voltage through the first power terminal and charge the sensing node to the power source voltage in response to a first precharging signal; and
a second precharging circuit connected between a second power terminal and the sensing node, the second precharging circuit adapted to accept the high voltage through the second power terminal and charge the sensing node to the high voltage in response to a second precharging signal.

8. The phase-changeable memory device as set forth in claim 7, wherein the first precharging circuit is a PMOS transistor connected between the first power terminal and the sensing node, and is adapted to respond to the first precharging signal,
wherein the second precharging circuit is a PMOS transistor connected between the second power terminal and the sensing node, and is adapted to respond to the second precharging signal.

9. A method of reading data in a phase-changeable memory device, the method comprising:
discharging a bitline that is connected to a memory cell;
charging the bitline with using an externally provided power source voltage;
charging the bitline with using a high voltage after charging the bitline with using the power source voltage, wherein the high voltage is higher than the power source voltage;
providing a read current to the bitline with using the high voltage; and
sensing a voltage of the bitline with using the high voltage and reading data from the memory cell.

10. The method as set forth in claim 9, wherein the memory cell comprises:
a memory element containing a phase-changeable material; and
a selection element provided to select the memory cell,
wherein the selection element is a diode connected between the memory element and a wordline.

11. A phase-changeable memory device comprising:
a memory cell connected to a bitline;
a precharging circuit charging the bitline to a precharging voltage;
a bias circuit providing a read current to the bitline with using a high voltage larger than the precharging voltage;
a sense amplifier detecting a voltage level of the bitline with using the high voltage; and
a high voltage circuit generating one of the precharging and high voltages from a power source voltage.

12. The phase-changeable memory device as set forth in claim 11, wherein the memory cell comprises:
a memory element containing a phase-changeable material; and
a selection element provided to select the memory cell,
wherein the selection element is a diode connected between the memory element and a wordline.

13. The phase-changeable memory device as set forth in claim 11, wherein the precharging voltage is the power source voltage.

14. The phase-changeable memory device as set forth in claim 11, wherein the sense amplifier compares a voltage of the bitline with a reference voltage and reads data from the memory cell.

15. The phase-changeable memory device as set forth in claim 14, wherein the precharging voltage is the reference voltage.

16. The phase-changeable memory device as set forth in claim 11, which further comprises a clamping circuit connected between the bitline and a sensing node, regulating a voltage of the bitline,
wherein the sensing node is connected with the precharging and bias circuits.

17. The phase-changeable memory device as set forth in claim 16, wherein the precharging circuit is connected between a power terminal and the sensing node, accepting the precharging voltage through the power terminal and charging the sensing node to the precharging voltage during a precharging operation.

18. The phase-changeable memory device as set forth in claim 17, wherein the precharging circuit includes a PMOS transistor having a source connected to the power terminal, a drain connected to the sensing node, a gate to which a precharging signal is applied, and a bulk boosted by the high voltage.

19. A method of reading data in a phase-changeable memory device, the method comprising:
  discharging a bitline connected to a memory cell;
  precharging the bitline to a precharging voltage;
  providing a read current to the bitline with using a high voltage larger than the precharging voltage; and
  sensing a voltage level of the bitline with using the high voltage and reading data from the memory cell.

20. The method as set forth in claim 19, wherein the memory cell comprises:
  a memory element containing a phase-changeable material; and
  a diode connected between the memory element and a wordline.

21. The method as set forth in claim 20, wherein in precharging the bitline, the bitline is clamped on a threshold voltage of the diode.

22. The method as set forth in claim 19, wherein the precharging voltage is a power source voltage.

* * * * *